United States Patent
Parker et al.

(10) Patent No.: US 7,295,031 B1
(45) Date of Patent: Nov. 13, 2007

(54) METHOD FOR NON-CONTACT TESTING OF MARGINAL INTEGRATED CIRCUIT CONNECTIONS

(75) Inventors: Kenneth P. Parker, Ft. Collins, CO (US); Chris R. Jacobsen, Ft. Collins, CO (US); Dayton Norrgard, Ft. Collins, CO (US); Myron J. Schneider, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/484,952

(22) Filed: Jul. 12, 2006

(51) Int. Cl.
*G01R 31/26* (2006.01)
*G01R 31/04* (2006.01)

(52) U.S. Cl. .................... 324/765; 324/538
(58) Field of Classification Search ............ None
See application file for complete search history.

(56) References Cited

U.S. PATENT DOCUMENTS

| | | | |
|---|---|---|---|
| 5,124,660 A | 6/1992 | Cilingiroglu | |
| 5,420,500 A | 5/1995 | Kerschner | |
| 5,498,964 A | 3/1996 | Kerschner et al. | |
| 5,557,209 A | 9/1996 | Crook et al. | |
| 5,677,634 A | 10/1997 | Cooke et al. | |
| 6,600,325 B2 | 7/2003 | Coates et al. | |
| 6,975,978 B1 * | 12/2005 | Ishida et al. ............ | 703/15 |
| 7,242,198 B2 * | 7/2007 | Schneider et al. ....... | 324/686 |
| 2003/0016044 A1 | 1/2003 | Ishida et al. | |
| 2005/0077911 A1 | 4/2005 | Miyasaka | |

* cited by examiner

*Primary Examiner*—Vinh Nguyen
*Assistant Examiner*—Trung Q. Nguyen

(57) ABSTRACT

Non-contact connectivity testing of joints connecting circuit junctions are improved through knowledge of characteristics of semiconductor junctions connected to component nodes of components of a device under test (DUT) to allow detection of high-impedance joints.

14 Claims, 9 Drawing Sheets

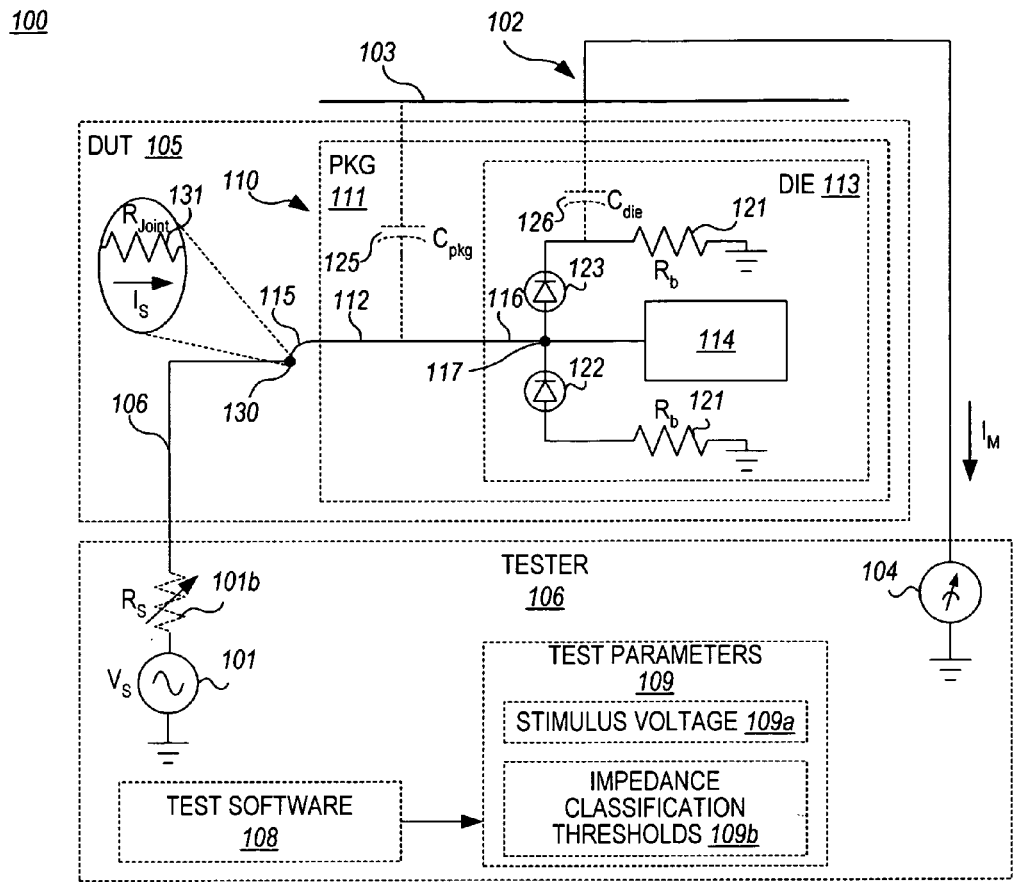
FIG. 5A
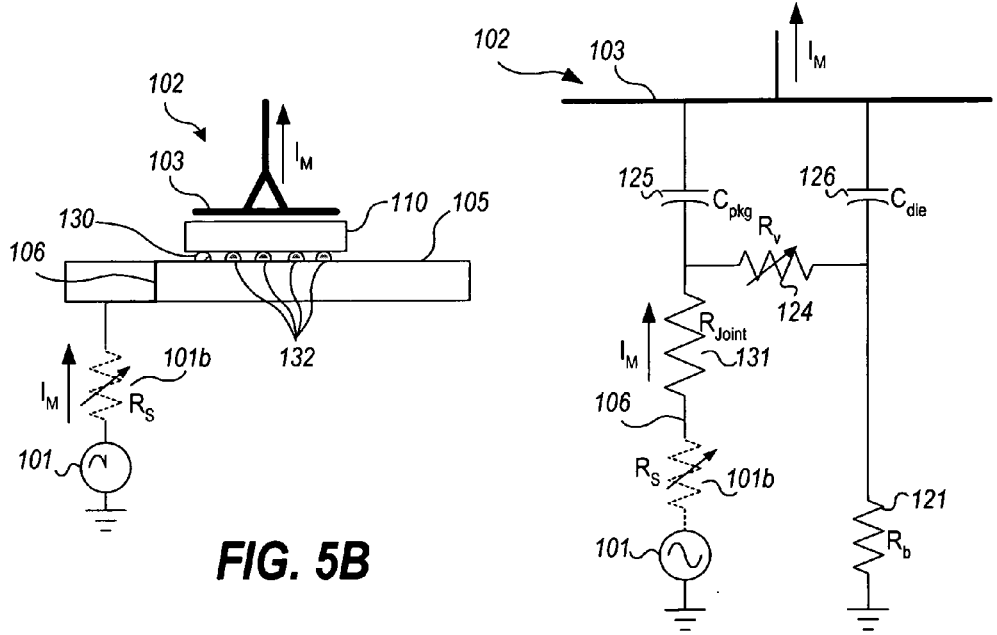
FIG. 5B
FIG. 5C

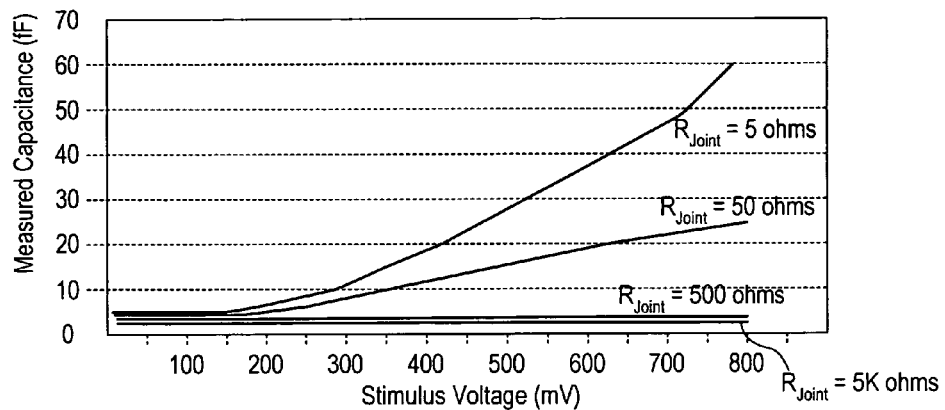
FIG. 6
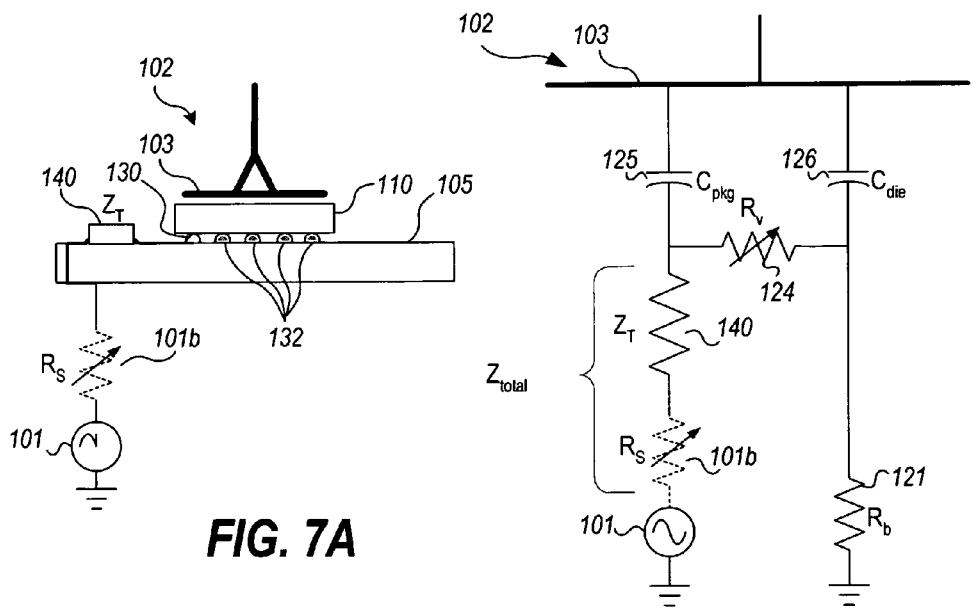
FIG. 7A
FIG. 7B

400

401 DETERMINE STIMULUS VOLTAGE RANGE CORRESPONDING TO MEASURABLE DIFFERENCE IN CAPACITANCE BETWEEN LOW RESISTANCE AND HIGH RESISTANCE AT JUNCTION

402 SELECT STIMULUS VOLTAGE TO VALUE THAT YIELDS RELATIVELY LARGE CAPACITANCE MEASUREMENT DIFFERENCE BETWEEN LOW AND HIGH RESISTANCE AT JOINT

403 SET CLASSIFICATION THRESHOLD TO VALUE THAT RELIABLY DISTINGUISHES BETWEEN A LOW IMPEDANCE JOINT AND A HIGH IMPEDANCE JOINT AT THE SELECTED STIMULUS VOLTAGE VALUE

501 CONFIGURE TEST PARAMETERS BASED ON SPECIFIC SEMICONDUCTOR JUNCTION CHARACTERISTICS

502 PLACE SENSOR OF CAPACITIVE SENSING PROBE ON OR IN CLOSE PROXIMITY TO COMPONENT NODE CONNECTED TO SEMICONDUCTOR JUNCTION

503 APPLY STIMULUS VOLTAGE TO DUT NODE OF DUT THAT SHOULD BE CONNECTED TO COMPONENT NODE BY JOINT UNDER TEST

504 OBTAIN MEASUREMENT REPRESENTATIVE OF CAPACITANCE BETWEEN SENSOR OF PROBE AND COMPONENT NODE

505 CLASSIFY CONNECTIVITY OF JOINT UNDER TEST BASED ON MEASUREMENT AND CLASSIFICATION THRESHOLD

506 JOINT CLASSIFICATION?
- GOOD (Low Impedance) → 507 INDICATE JOINT IS GOOD
- BAD (High Impedance) → 508 INDICATE HIGH IMPEDANCE JOINT

*FIG. 14*

METHOD FOR NON-CONTACT TESTING OF MARGINAL INTEGRATED CIRCUIT CONNECTIONS

BACKGROUND OF THE INVENTION

Capacitive lead-frame sensing technologies are typically used to detect opens between an integrated circuit (IC) signal pin and a mounting substrate (e.g., a printed circuit board). The amplitude of the alternating current (AC) stimulus is normally set to a level that ensures that semiconductor junctions, from which the functional circuitry of the integrated circuit is formed, do not turn on. The primary concern with turning on semiconductor junctions is damage to the IC device being tested due to excessive current.

When semiconductor junctions are turned on, the current supplied from the stimulus must be limited in magnitude and duration to prevent damage. The traditional semiconductor junction turns on at an AC stimulus of approximately 700 mV peak. Thus, the typical AC test stimulus for capacitive lead-frame technologies has been set around 200 mV, at which it is assumed that the junction current is insignificant to device damage and measurement stability.

Semiconductor junctions in newer technologies do not necessarily turn on at the traditional 700 mV due to advancements in semiconductor processing technology (shrinking geometries, changes in doping materials and doping concentrations, etc.) Furthermore, the knee at which these newer semiconductor junctions turn on is not necessarily a sharp transition at a single threshold voltage, but instead is a curve that could transit a significant voltage range. It is also common for a single IC to contain multiple groups of pins that have different junction characteristics.

Almost all pins on modern ICs include some level of protection for electrostatic discharge (ESD). ESD protection circuits commonly incorporate one or more diodes (semiconductor junctions) designed to turn on and discharge energy before any damage is done to internal circuitry. A simple example of traditional ESD protection circuitry is shown in FIG. 1 for an example circuit device, shown at 1, that includes at least one input 2 and one output 8. As shown, the input 2 receives a signal INPUT to be driven to internal circuitry 5. ESD protection on the input 2 includes a first pair of diodes 3, 4 (one 3 forward biased from ground to the input node 2, and the other 4 forward biased from the input node 2 to the power source $V_{CC}$), which protects the internal circuitry 5 connected to the input 2. ESD protection on the output 8 includes a second pair of diodes 6, 7 (one 6 forward biased from ground to the output 8, and the other 7 forward biased between from the output 8 to the power source $V_{CC}$), which protects the internal circuitry 5 connected to the output 8.

When one refers to a diode "turning on", one is usually referring to the voltage level (typically referred to as the "threshold voltage") at which the forward conducting current becomes significant. In reality, diodes conduct some current even before the knee at which the current becomes exponentially greater. FIG. 2 shows the traditional diode curve that might be exhibited by the circuit in FIG. 1. Assuming that only one diode is forward conducting at once and that the other conducts a minuscule reverse current, the circuit in FIG. 1 reduces to a simple diode and can be understood using the simplified diode equation:

$$i = I_0 \left( e^{\frac{qV}{nkT}} - 1 \right) \quad \text{Equation (1)}$$

where i is the diode current in amps, $I_o$ is the reverse saturation current in amps, q is the electron charge in coulombs, V is the diode voltage in volts, n is a dimensionless ideality factor, k is Boltzmann's constant, and T is the temperature in Kelvins.

As shown in FIG. 2, the circuit 1 in FIG. 1 has a recognizable forward conducting knee (shown at 15) of 700 mV at which the current is approximately 0.5 nA. The current at 200 mV (500 mV below the knee) is a mere 50 fA and unlikely to affect the capacitive lead-frame measurements.

The current-voltage (IV) curve of FIG. 2 is not necessarily representative of all semiconductor junctions in newer technologies. Moreover, not all newer technologies will use a simple protection circuit as shown in FIG. 1 because changing input/output (IO) standards may require protection of even lower voltage logic due to higher energy levels.

An alternative circuit shown in FIG. 3 employs a two-stage approach to ESD protection of sensitive circuits. The behavior of the circuit in FIG. 3 cannot be modeled by Equation 1. Even though ESD protection circuits for newer technologies are not predictable, however, at the basic level they almost invariably consist of one or more semiconductor junctions that either explicitly or implicitly carry some of the same characteristics as a diode. One characteristic is a non-linear current-voltage (IV) curve similar in shape to the curve in FIG. 2 that results from the cumulative effects of the current through one or more junctions.

A second characteristic is a dependence of the current on temperature. Equation 1 explicitly includes temperature in the denominator of the exponential term. This would seem to imply that an increasing temperature causes a decrease in current for the diode (and thus any semiconductor junction with diode characteristics). The reality is normally the exact opposite because the reverse saturation component $I_o$ is also temperature dependent. The closer the applied voltage is to the forward conducting knee of the diode curve, the greater effect temperature will have on the current.

Capacitive lead-frame testing techniques rely on the ability of the tester to distinguish between very small differences in measured capacitance or measured current flow to allow the device tester to distinguish between the presence or non-presence of open, shorted, or otherwise defective joints of components of a device under test. Non-contact capacitive sensing testing techniques are described in detail in U.S. Pat. No. 5,557,209 to Crook et al, U.S. Pat. No. 5,498,964 to Kerschner et al., U.S. Pat. No. 5,420,500 to Kerschner, U.S. Pat. No. 5,254,953 to Crook et al., and U.S. Pat. No. 5,124,660 to Cilingiroglu, all of which are hereby incorporated by reference for all that they teach. In the past, as described previously, the geometry of the junctions were such that the traditional semiconductor junctions were characterized by a single threshold voltage—that is, all semiconductor junctions on a given device under test could be relied upon to turn on at or within a margin of error of a single threshold voltage (typically at approximately 700 mV). During a non-contact capacitive sensing test, therefore, this allowed the use of a single universal stimulus voltage level for stimulating all nodes under test of the device. The typical AC test stimulus voltage for capacitive lead-frame technologies has been set around 200 mV, at which it could be assumed that the junction current is sufficiently low to eliminate risk of damage to the device under test.

However, because advancements in semiconductor processing technology (shrinking geometries, changes in doping materials and doping concentrations, etc.) has lead to semiconductor junctions that turn on not at a single threshold voltage (or sharp knee), but rather semiconductor junctions that may be characterized by different junction characteristics relative to one another, and that turn on over a significant range of the stimulus voltage, the use of a single universal value of the stimulus voltage applied to all nodes under test of a device during a capacitive lead-frame test may be inappropriate, inefficient, or even problematic.

A technique has been developed as described in U.S. Patent Ser. No. 11/170,366 (publication number US2007/001687) in which semiconductor junction characteristics are utilized to find open connections at junctions between device under test nodes and nodes of components on the device under test.

Open connections are only one of several different types of manufacturing defects. Typical defect mechanisms can produce resistive joints with an elevated DC impedance. Resistive connections will have an unacceptably elevated series resistance between board-level signals and the intended IC pin connections. A "good" connection may have a series resistance in the milli-ohm range. Defective joints, such as those that are cracked by board flexure or those improperly wetted during solder reflow, may have series impedances much higher than normal, perhaps into the tens, to hundreds or even thousands of ohms. Such impedances might be tolerable on high-impedance inputs to ICs that do not draw a significant current during operation, but these impedances cannot be tolerated anywhere that significant currents do flow between IC and board-level signals. Their inserted impedance will cause unacceptable voltage drops that compromise circuit behavior.

Whereas open connections caused by missing solder may be evident using visual or X-Ray inspection, a resistive joint is quite often invisible to inspection. Therefore, a practical means of testing for resistance joints between IC pins and board-level signals is needed. This has become more prominent now that the electronics industry has moved towards new soldering technologies using lead-free alloys that are more prone to cracking and wetting problems.

SUMMARY OF THE INVENTION

Embodiments of the invention utilize knowledge of characteristics of semiconductor junctions connected to component nodes of components of a device under test (DUT) to improve configuration of test parameters and to allow detection of high-impedance joints.

In one embodiment, a method for configuring parameters of a non-contact capacitive sensing test of a device under test includes applying a stimulus voltage to a node under test, for each of a plurality of series resistance values in a predetermined range of series resistance values, obtaining a corresponding respective measurement representative of the capacitance between a sensor of a capacitive sensing probe and a given component node of a component of the device under test (DUT) to which a DUT node of the DUT is supposed to be connected, based on the obtained measurements, determining semiconductor junction characteristics specific to the given component node of the component of the DUT, and setting test parameters based on the semiconductor junction characteristics specific to the given component node.

In another embodiment, a method for determining connectivity of a joint between a component node of a component of a device under test (DUT) and a DUT node of the DUT, wherein the component node is connected to a semiconductor junction within the component of the DUT, includes obtaining semiconductor junction characteristics specific to the component node, selecting a stimulus voltage based on the semiconductor junction characteristics specific to the component node, wherein the selected stimulus voltage is set to a value that yields a relatively large capacitance measurement difference between a low impedance joint and a high impedance joint, configuring at least one classification threshold based on the semiconductor junction characteristics of the component node, the at least one classification threshold set to allow reliable classification of the joint as high impedance or low impedance based on a non-contact test measurement representing capacitance between a component node of a component of a device under test that is connected to the joint under test and a sensor of a capacitive sensing probe, placing a capacitive sensing probe on or in proximity to the component node of the component of the DUT and not on or in proximity to any semiconductor junction of the component that is not connected to the component node, applying the selected stimulus voltage to the DUT node, obtaining a measurement representative of an amount of capacitance between the component node and the capacitive sensing probe, and classifying the joint based on the measurement and the at least one classification threshold.

In another embodiment, a method for determining whether a pin of an electrical component of an electrical device under test (DUT) can be tested for high-impedance connectivity using non-contact connectivity testing, wherein the pin is connected to a semiconductor junction of the electrical component and connected to a DUT node of the DUT, includes obtaining an approximate value of termination resistance between a voltage source and the pin, obtaining a stimulus voltage, if the approximate value of the termination resistance is approximately zero at the stimulus voltage, performing the steps of determining whether a difference in effective capacitance for a low calibration resistance versus a high calibration resistance between the voltage source and the pin is significant with respect to the measurement's accuracy, classifying the pin as a good candidate for non-contact connectivity testing if the difference in capacitance is significant with respect to the measurement's accuracy, and classifying the pin as not a good candidate for non-contact connectivity testing if the difference in capacitance is not significant with respect to the measurement's accuracy; and if the termination resistance is not approximately zero, performing the steps of selecting a calibration resistance close in value to the termination resistance, determining whether, at the high end of the stimulus voltage, the difference in effective capacitance for a selected calibration resistance versus a high calibration resistance is significant with respect to the measurement's accuracy, classifying the pin as a good candidate for non-contact connectivity testing if the difference in capacitance is significant with respect to the measurement's accuracy, and classifying the pin as not a good candidate for non-contact connectivity testing if the difference in capacitance is not significant with respect to the measurement's accuracy.

In another embodiment, a method for optimizing test parameters specific to a semiconductor junction for use in a non-contact connectivity test by a semiconductor tester includes determining a stimulus voltage range corresponding to a measurable difference in capacitance within a measurement accuracy of the tester between a low resistance joint and a high resistance joint at a junction under test, selecting a stimulus voltage value within the stimulus voltage range such that the selected stimulus voltage yields a relatively large capacitance measurement difference between a low impedance joint and a high impedance joint, and selecting one or more classification thresholds to respective one or more values which allow reliable classification of a joint under test as high impedance or low impedance based on a non-contact test measurement representing capacitance between a component node of a component of a device under test that is connected to the joint under test and a sensor of a capacitive sensing probe.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 5A is a schematic block diagram of a test setup for non-contact capacitive sensing testing of the resistivity of a joint connecting a component node of a component mounted on a device under test (DUT) and a DUT node of the DUT;

FIG. 5B is a schematic block diagram of the equivalent circuit of FIG. 5A;

FIG. 5C is a schematic diagram of an equivalent circuit of the circuit of FIGS. 5A and 5B;

FIG. 6 is a capacitance-stimulus voltage plot of test measurements obtained from testing the circuit of FIGS. 5A-5C for 4 different series joint resistance values;

FIG. 7A is a schematic block diagram of a test setup for non-contact capacitive sensing testing of the resistivity of a joint connecting a component node of a component mounted on a device under test (DUT) and a DUT node of the DUT, wherein the component node includes a series termination resistance;

FIG. 7B is a schematic diagram of an equivalent circuit of the circuit of FIG. 7A;

FIG. 13 is a flowchart of an embodiment of a method for optimizing the test parameters specific to a semiconductor junction for use in a non-contact connectivity test;

FIG. 14 is a flowchart of an embodiment of a method for running a non-contact connectivity test.

DETAILED DESCRIPTION

Figure 1:
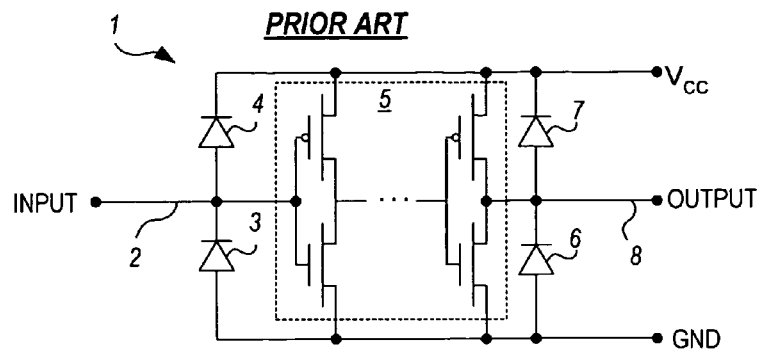
FIG. 1 is a schematic diagram of a prior art electronic device with electrostatic discharge (ESD) protection circuitry.
Figure 2:
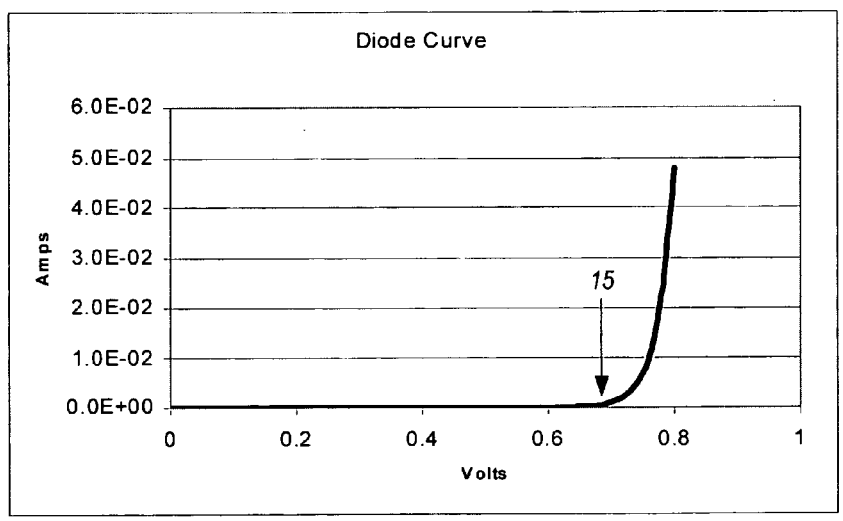
FIG. 2 is a graph illustrating the current-voltage (IV) relationship of the circuit of FIG. 1.
Figure 3:
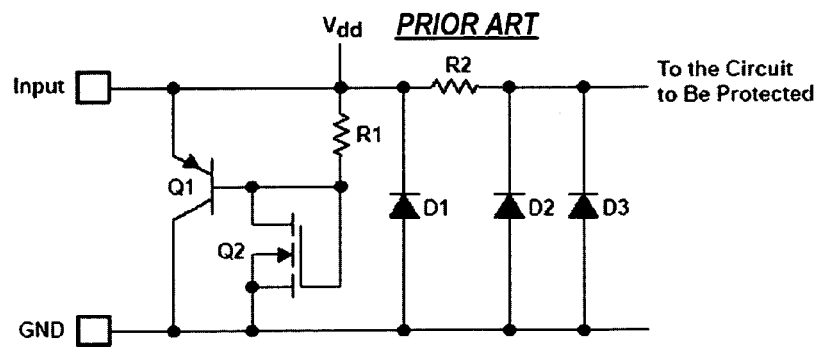
FIG. 3 is a schematic diagram of one example of a prior art two-stage ESD protection circuit.

For simplicity and illustrative purposes, the principles of the embodiments are described. Moreover, in the following detailed description, references are made to the accompanying figures, which illustrate specific embodiments. Electrical, mechanical, logical and structural changes may be made to the embodiments without departing from the spirit and scope of the embodiments.

As used herein, the term "node" refers to the conductive portion of an electrical device that forms a single electrical point in the equivalent schematic diagram of the electrical device. For example, a node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof. For purposes of simplicity of description, whenever the term "node" is used in conjunction with a particular portion of an electrical device, e.g., "component node", the node refers only to the single electrical point in the equivalent schematic diagram of the named element, e.g., "component" in the present example. The node is therefore to be viewed as the node of the named element, separate and apart from any other elements that may be connected together to form a larger circuit. Thus, in an illustrative embodiment, a node of a component may be connected to a node of a printed circuit board by way of a "joint". Although the node of the component and the node of the printed circuit board are the same node in the schematic diagram of the larger circuit that includes both the printed circuit board and the component, when the term "component node" is used, it refers only to the conductive portion of the component separate and apart from the larger circuit. Similarly, when the term "PCB node" or "DUT" node is used, it refers only to the conductive portion of the PCB or DUT separate and apart from the conductive portion(s) of any component(s) mounted thereon. The purpose of this distinction is to distinguish between the separate conductive portions on either side of a connecting joint, which assists in the understanding of embodiments of the invention as described herein.

As used herein, the term "pin" refers to a wire, a trace, a pad, a terminal, a solder bump, or any other conductive portion, or combination thereof, of an electrical device that is conductively connected to a semiconductor junction in a semiconductor device. Typically, a pin will be an input and/or output terminal of a packaged integrated circuit, whereby the pin is conductively connected to a semiconductor junction within a packaged die. However, a pin may also refer to a bondwire connected to a die. A pin may also be a wire terminal of a resistor or capacitor. These are only a few examples named herein for illustration but not limitation.

Embodiments of the invention utilize knowledge of the characteristics of internal semiconductor junctions of electrical devices to improve detection and classification of high- and low-impedance resistive joint connections in non-contact, capacitive sensing testing of semiconductor devices.

Figure 4A:
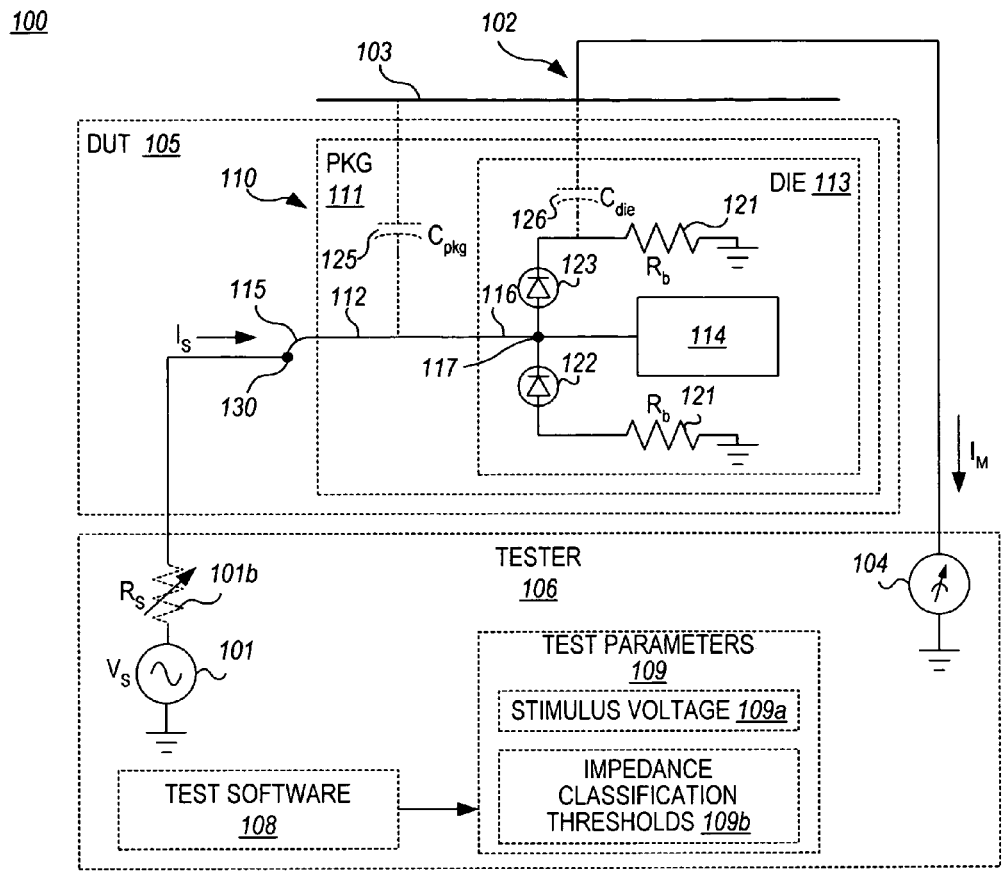
FIG. 4A is a schematic block diagram of a prior art circuit for measuring the current-voltage (IV) relationship of a node under test of a printed circuit board (PCB) that is connected to a pin of an integrated circuit component.
Figure 4B:
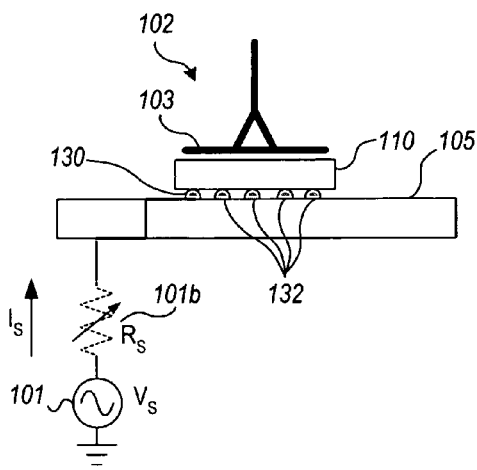
FIG. 4B is a schematic block diagram of the equivalent circuit of FIG. 4A.

FIGS. 4A and 4B show a non-contact capacitive sensing measurement system 100. The system 100 is configured to test an IC component 110 (e.g., an IC) of a device under test (DUT) 105 (e.g., a PCB). The IC component 110 includes circuitry 114 implemented on a die 113 that is protected at an internal input/output die node 117 by ESD protection diodes 122, 123. Die node 117 is connected to a package leadframe 112 by a bondwire 116. The package leadframe 112 is connected to a package pin 115 of the IC component package 111, which is connected, by way of a solder joint, wirebond, or other joint 130, to a node 106 (e.g., a trace, pad, pin, etc.) on the DUT 105 (i.e., a PCB).

A tester 106, for example an industrial in-circuit printed circuit board (PCB) tester, applies an alternating current (AC) stimulus voltage 101 to the DUT node 106 on the DUT 105. In one embodiment, the tester 106 may include a series resistance $R_S$ 101b in series with the input stimulus voltage 101 as a current limiting device for protection of internal IC circuitry. The series resistance $R_S$ 101b may also be useful for measuring current to generate current-voltage (IV) and capacitance-voltage (CV) curves. The tester 106 is connected to a capacitive sensing probe 102. The capacitive sensing probe 102 is configured with a sensor plate 103.

During a test, the sensor plate 103 of the capacitive sensing probe 102 is positioned on or in close proximity to the package 111 of the IC component 110 whose pin 115 is supposed to be connected to the DUT by way of a joint 130. A measurement device 104 measures current flow from the IC component 110 to the sensing probe 102 due to capacitive coupling $C_{pkg}$ between the leadframe 112 of the package 111 and the sensor plate 103 of the sensing probe 102. Test software 108, which may be integrated into the tester 106 itself (as shown), or which may execute remotely on a remote computer system (not shown), may allow configuration of test parameters 109 (such as the level of the stimulus voltage 109a and values of the impedance classification threshold(s) 109b), and processes the measurements as hereinafter described.

When the stimulus voltage 101 is small compared to the knee voltage of the diode semiconductor junctions 122, 123, the capacitive sensing probe 102 will sense a capacitance equal to $C_{pkg}$. This is because the current flowing through the diodes 122, 123 is negligible. The current through the diodes will increase as the stimulus voltage approaches the diode knee voltage. Some of the diode current will flow to the capacitive sensing probe 102 through capacitive coupling $C_{die}$ between the die 113 and the sensor plate 103, and some will flow through the resistance $R_b$ 121 back to ground. The resistance $R_b$ 121 may comprise bulk die, interconnect, etc. The capacitance $C_{die}$ is the capacitance formed between the sensor plate 103 and the metal interconnect on the other side of the diode. Its value will depend on the amount of current flowing through its AC impedance.

Figure 4C:
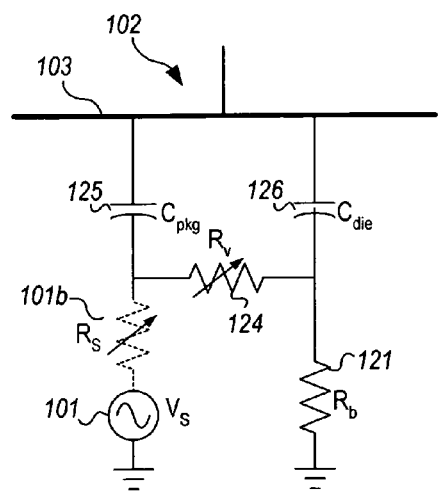
FIG. 4C is a schematic diagram of an equivalent circuit of the circuit of FIGS. 4A and 4B.

An equivalent circuit for the measurement system of FIGS. 4A and 4B is shown in FIG. 4C. The diode 122, 123 has been replaced with a variable resistance $R_v$ 124 because the diode (speaking in the singular since only one diode 122, 123 can be "on" at any given time) really represents a dynamic resistance to the circuit—that is, as the stimulus voltage increases, the diode current increases faster and therefore causes the dynamic resistance to decrease non-linearly with voltage. If the joint 130 between DUT node 106 and component pin 115 is well connected, the joint 130 will have a negligible impedance, and hence the effective capacitance picked up at the sensor plate 103 is represented by:

$$Ceff = \frac{1}{Z_{pkg}} + \frac{1}{Z_{die}}\left(\frac{R_B\|Z_{die}}{(R_B\|Z_{die}) + R_V}\right). \quad \text{Equation (2)}$$

However, if the joint 130 between DUT node 106 and component pin 115 is not well connected, a series resistance $R_{joint}$ will be introduced into the circuit as shown in FIGS. 5A, 5B and modeled in FIG. 5C.

In a simulated test, test measurements resulting from testing of the circuit of FIGS. 5A-5C for 4 different values of $R_{Joint}$ were obtained and are presented in FIG. 6 in graphical form plotting measured capacitance versus stimulus voltage. The graph shows the family of curves obtained using series resistance $R_{Joint}$ values of 5, 50, 500 and 5K Ohms. In obtaining these curves, the stimulus AC voltage was swept from 50 to 800 millivolts. The effective measured capacitance was then plotted for each of the 4 series resistances $R_{Joint}$. The data confirms that for a lower joint resistance ($R_{Joint}$=5 ohms), the diode effect is readily apparent. As the resistance is increased to 50, 500 and 5K ohms, the diode effect is less apparent and the maximum measured value drops off precipitously.

If 5 ohms represents a near perfect joint and 5K ohms represents a nearly open connection, it is evident from the graph in FIG. 6 that the difference between good and open joint connections is easily differentiated given sufficient stimulus voltage. The difference between 5 ohms and 50 ohms is also quite evident, as is the difference between 50 and 500 ohms. Thus, by setting appropriate stimulus voltage thresholds, the non-contact testing techniques can be utilized to test for open connections and marginal, high-impedance joints.

A good spread between measured values is needed to avoid the problem of false failures (that is, when a good joint is declared to be marginal or open). Some variation between ICs is to be expected, and since the diode effect has a temperature component (see Equation 1), environmental effects can occur. Running the tests at several voltages will help by increasing the spread at higher voltages, and by demonstrating the diode curve (or lack thereof) across multiple voltages.

In some cases, opens testing is conducted through intervening components such as series termination resistors. (In some cases the series device may be reactive, such as a DC-blocking capacitor. Its impedance is a function of the component value and the frequency of the AC stimulus signal.) An example of such a case is shown in FIGS. 7A and 7B. The model of the defect-free case (i.e., low joint impedance) is identical to the model in FIG. 5C of the resistive joint model. If indeed the pin is also resistive, this resistance will add with the series resistance, creating a total resistance $Z_{Total}$. If the joint resistance $R_{joint}$ is a relatively small value compared to the series termination $Z_T$, then the joint resistance $R_{joint}$ will be undifferentiable from the expected series termination $Z_T$. This can be compensated for by raising the classification threshold used to declare a joint to be "marginal" (e.g., high-impedance) rather than "good" (e.g., low-impedance).

Figure 8:
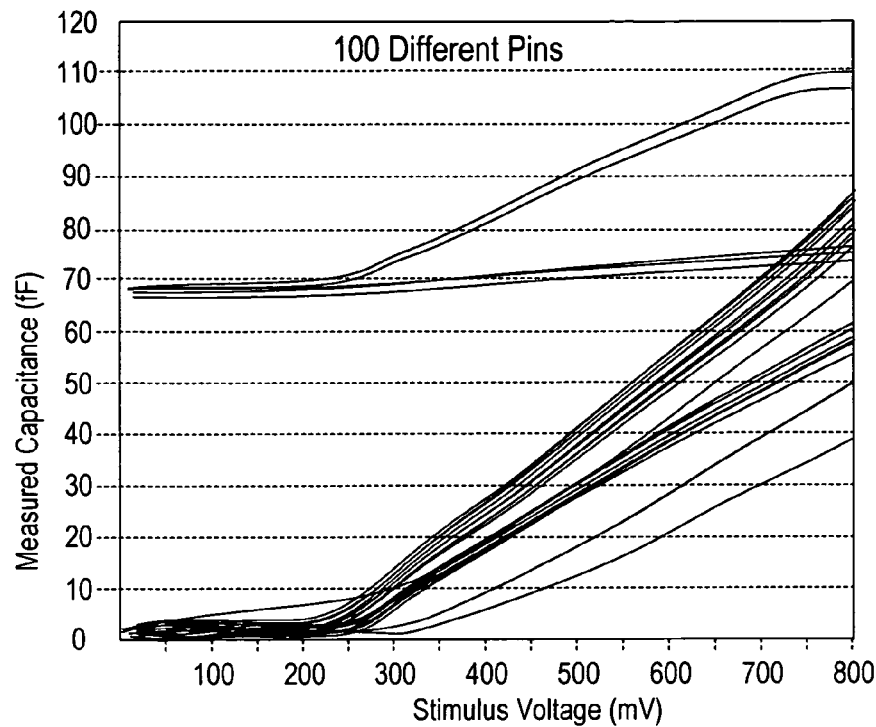
FIG. 8 is a graph illustrating the capacitance-stimulus voltage curves plotted for 100 different pins of a DUT.

A given pin or set of pins may behave somewhat differently compared to others, as illustrated by the CV curves plotted for 100 different pins of a DUT shown in FIG. 8. Accordingly, the classification threshold may need to be set differently for different pins.

Figure 9:
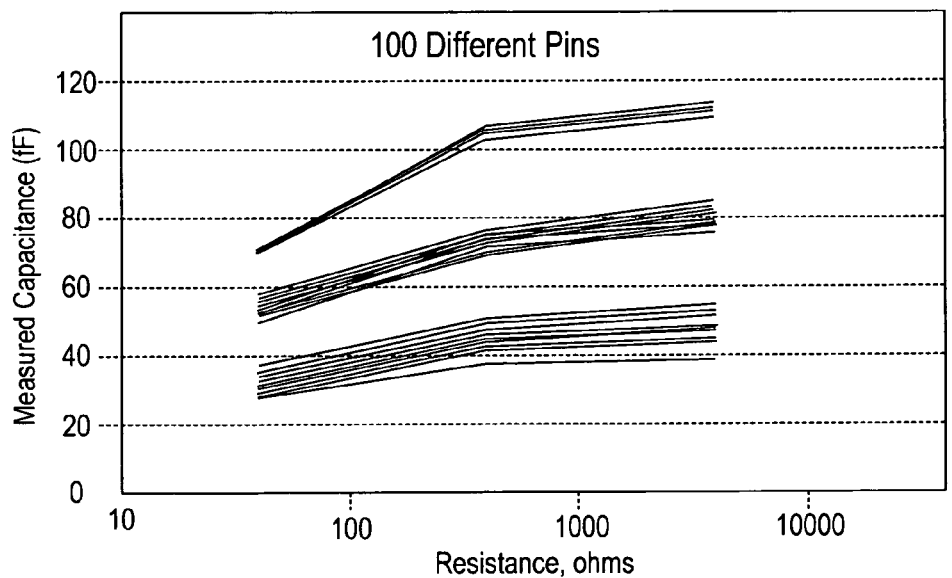
FIG. 9 is a graph illustrating the capacitance-resistance curves plotted for 100 different pins of a DUT obtained with a constant stimulus voltage.

It may be useful to consider how the capacitance of a given pin changes at a given stimulus voltage when the series impedance varies. The graph in FIG. 9 shows the change in capacitance versus series resistance plotted for 100 pins of an IC at a stimulus voltage of 800 mV. The change in capacitance is plotted using series resistance $R_{Joint}$ values of 5, 50, 500 and 5K Ohms. In this example graph, the pins change by over 20 fF between 5 and 50 ohms. Others change as much as 70 fF. Again, there is evidence of "family" groupings among the pins.

Figures 10A, 10B:
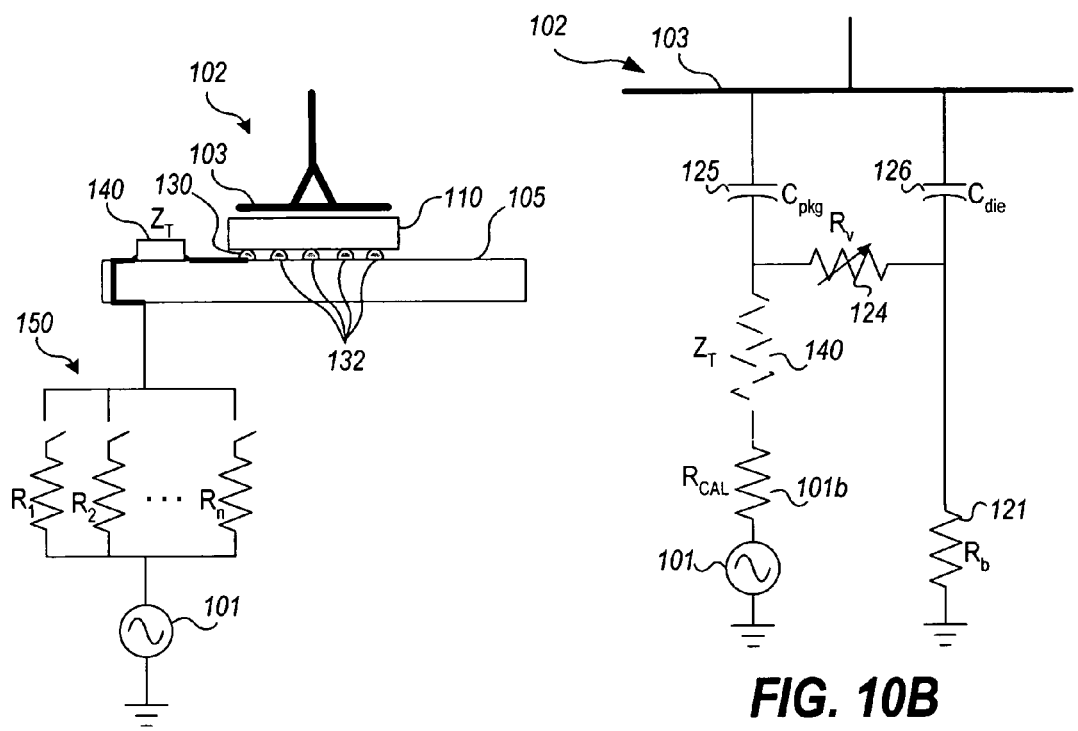
FIG. 10A is a block diagram of a calibration setup used to determine whether a pin is a good candidate for non-contact connectivity testing.
FIG. 10B is a schematic diagram of an equivalent circuit of the calibration setup of FIG. 10A.

To perform useful testing, a given pin's performance parameters need to be characterized in order to determine if it is a candidate for effective non-contact capacitive sensing testing with a low false-failure rate. This is especially important if the pin has marginal behavior, or if it is being tested through a series impedance $Z_T$ (e.g., as illustrated in FIGS. 7A-7B). A calibration setup such as that in FIG. 10A and modeled in FIG. 10B may be used to determine whether a pin is a good candidate for non-contact connectivity testing. In this setup, a voltage stimulus source 101 with a set of relays 150 is controlled by the tester to switch in one or more of the resistors from a set of calibration resistors R1 through Rn into the current path. In the model, this sets the calibration resistance $R_{cal}$. A series termination device 140 having resistance $Z_T$ may exist ($Z_T>0$), or may not ($Z_T=0$). Once a calibration setup is chosen, measurements are obtained for several stimulus voltage settings. This may be performed repetitively for a number of calibration setups, varying the calibration resistance $R_{cal}$, yielding a family of curves that may resemble those in FIG. 6 if the tested pin is a good candidate. A poor candidate pin will have a family of curves that have too little differentiation at the high end of the stimulus voltage settings, or that are flat, thus not exhibiting a diode curve. This will occur if $Z_T$ is too large, if the pin simply has too much coupling from $C_{pkg}$ relative to the amount contributed by $C_{die}$, or if the pin does not possess protection diodes.

When $Z_T$ exists ($Z_T>0$), the values chosen for $R_{cal}$ should be near the same order of magnitude as that of $Z_T$ (and greater). This implies that there is a lower threshold of $R_{Joint}$ that can be seen in the presence of $Z_T$ that limits the detection of a lower level of series joint impedance.

Figure 11:
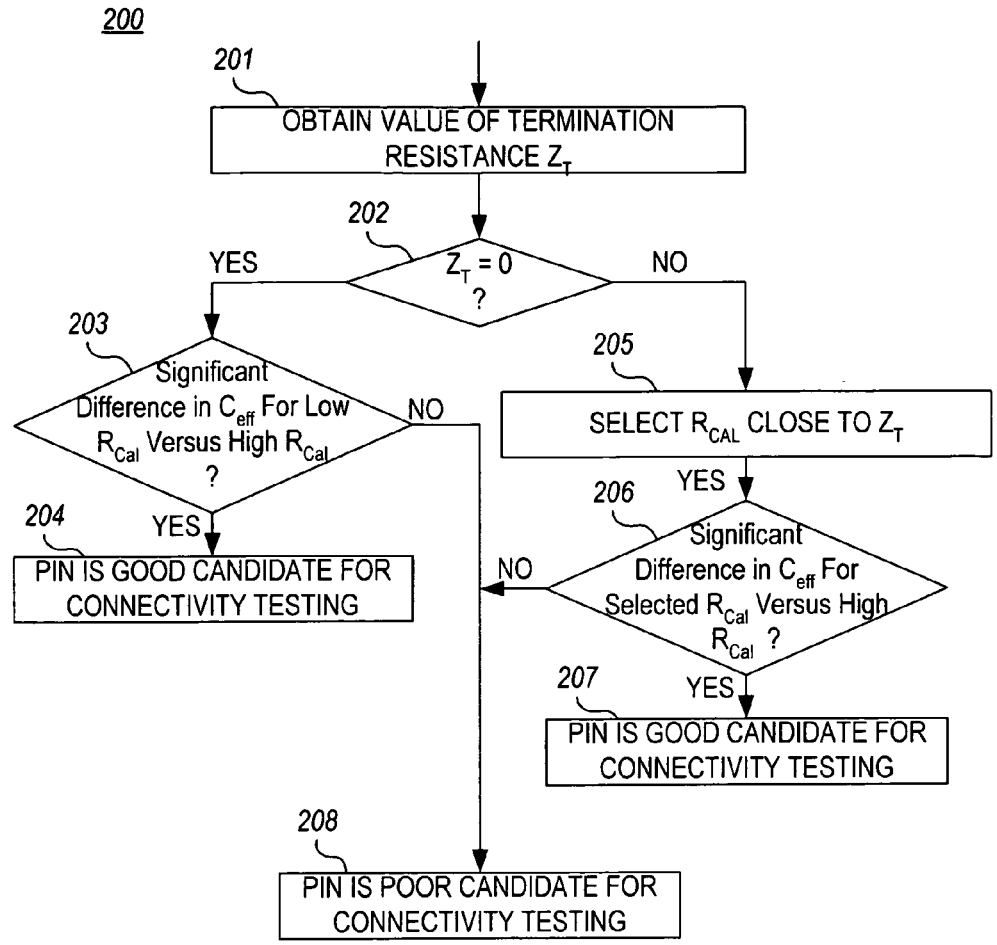
FIG. 11 is a flowchart of an embodiment of a method for determining if a candidate pin can be tested for non-contact connectivity testing.

FIG. 11 is an embodiment of a method 200 for determining if a candidate pin can be tested for non-contact connectivity testing. According to the method 200, the approximate value of the termination resistance $Z_T$ is determined (step 201 and 202). If the termination resistance $Z_T$ is negligible, then determine whether, at the high end of the stimulus voltage, the difference in effective capacitance for a low calibration resistance versus a high calibration resistance is significant with respect to the measurement's accuracy (step 203). If it is, then the pin is classified as a good candidate for non-contact connectivity testing (step 204). Otherwise, the pin is not a good candidate for such testing (step 208).

If the termination resistance $Z_T$ is not negligible ($Z_T>0$), then select a calibration resistance $R_{cal}$ that is close in value to $Z_T$ (step 205). Determine whether, at the high end of the stimulus voltage, the difference in effective capacitance for a selected calibration resistance $R_{cal}$ versus a high calibration resistance is significant with respect to the measurement's accuracy (step 206). If it is, then the pin is classified as a good candidate for non-contact connectivity testing (step 207). Otherwise, the pin is not a good candidate for such testing (step 208).

Figure 12:
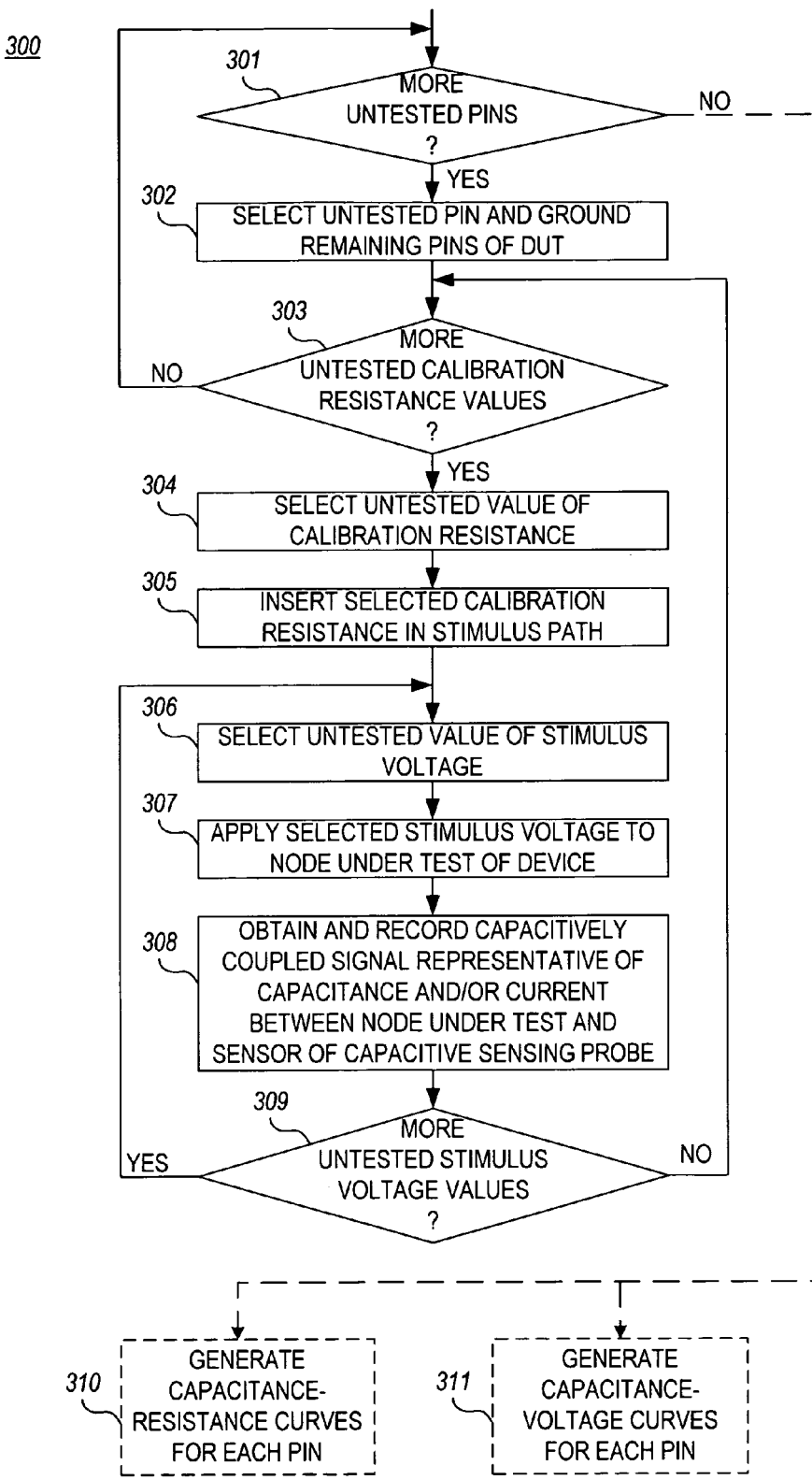
FIG. 12 is a flowchart of an embodiment of a method for using a series of different calibration resistors in the source path to simulate various marginal impedances.

FIG. 12 is an embodiment of a method 300 for using a series of different calibration resistors in the source path to simulate various marginal impedances. According to the method 300, given a list of pins to be tested and a set of calibration resistances available in the tester for inserting in the stimulus voltage path, a pin is selected from the list of pins to be tested, and all other pins on the IC are grounded (steps 301 and 302). A first untested calibration resistance value is selected from the set of calibration resistances (steps 303 and 304). The selected calibration resistance $R_{cal}$ is inserted in the stimulus path between the voltage source 101 and the pin 130 (step 305). An untested stimulus voltage from a range of stimulus voltages is selected (step 306). The selected stimulus voltage is applied to the DUT node to which the selected pin is supposed to be connected (step 307). A capacitive sensing probe 102 obtains a measurement representative of the capacitance between the stimulated DUT node 130 and the probe plate 103 of the capacitive sensing probe 102 (step 308). If more untested stimulus voltage values exist in the range of stimulus voltage values (determined in step 309), steps 306 through 309 are repeated until all stimulus voltage values in the range of stimulus voltage values are tested. When all stimulus voltage values in the range of stimulus voltage values are tested, steps 303 through 309 are repeated until all calibration resistance values in the set of calibration resistance values are tested. When all calibration resistance values in the set of calibration resistance values are tested, steps 301 through 309 are iteratively repeated until all pins in the list of pins to be tested are tested. From the recorded measurements, the capacitance-resistance curves (such as that shown in FIG. 9) may be plotted for each tested pin (step 310). Also from the recorded measurements, the capacitance-stimulus voltage curves (such as that shown in FIG. 6) may be plotted for each tested pin (step 311).

The observed behavior and conclusions drawn therefrom are used in one embodiment to configure test parameters (such as stimulus voltage and classification threshold levels) and to detect marginal (high impedance) connectivity of nodes of a device under test (DUT). FIG. 13 illustrates a method 400 for optimizing the test parameters specific to a semiconductor junction for use in a non-contact connectivity test. In this method, a stimulus voltage range corresponding to a measurable difference in capacitance between low resistance and high resistance at junction within the measurement accuracy of the tester is determined (step 401). In one embodiment, this step is performed by generating a capacitance-voltage curve, for example by performing the method 300 of FIG. 12, and finding the range in the CV curve where the difference in capacitance between a high impedance joint and a low impedance joint is relatively high. For example, within the accuracy of a particular tester, a relatively high difference in capacitance may be greater than 20 fF. The range may be determined numerically by a computer without actually generating a visual representation of the CV curves. Once the range is selected, a stimulus voltage value is selected within the range such that the selected stimulus voltage yields a relatively large capacitance measurement difference between a low impedance joint and a high impedance joint (step 402). For example, if FIG. 6 represents the CV curves of a particular semiconductor junction, the voltage range that would result in a capacitance difference of at least 20 fF between a low impedance joint (e.g., 5 ohms) and a high impedance joint (e.g., 50 ohms or greater) may be chosen to be approximately 500 mV or greater. The stimulus voltage may therefore be set to a value above 500 mV (above the diode knee of the curves) but below the maximum current limit of the semiconductor junction. Once the stimulus voltage is selected, one or more classification thresholds may be selected to value that reliably distinguishes between a low impedance joint and a high impedance joint at the selected stimulus voltage value (step 403). In this regard, a classification threshold may be set to a capacitance value such that joints may be reliably classified as "good" (low impedance) or "bad" (high impedance). For example, if FIG. 6 represents the CV curves of a particular semiconductor junction in this example, and if the stimulus voltage value selected from step 402 is set to 600 mV, then a classification threshold may be set, for example, to a measured capacitance of 30 fF. A joint whose corresponding measurement is at or above 30 fF would be classified as "good" (i.e., low impedance), and any measurement below 30 fF would be classified as "bad" (high impedance).

FIG. 14 is an embodiment of a method 500 for running a non-contact connectivity test. In this embodiment, test parameters are configured based on semiconductor junction characteristics of a given component node (e.g., a given pin) of a component of a DUT (step 501). For example, the test parameters may include a stimulus voltage value and corresponding classification threshold(s) specific to a given component node. The sensor of a capacitive sensing probe is placed on or in proximity to the given component node of the component of the DUT (step 502), the component node being connected to a semiconductor junction. A stimulus voltage, determined from specific semiconductor junction characteristics of the semiconductor junction connected to the given component node, is then applied to a device under test (DUT) node of the DUT that is supposed to be connected to the component node by way of a connecting joint (e.g., a solder joint) (step 503). A measurement is obtained representing the capacitance between the component node and the sensor of the capacitive sensing probe (step 504). The obtained measurement or a derivative thereof is compared to a classification threshold specific to the semiconductor junction connected to the component node (step 505). A joint which is supposed to connect the component node to the DUT node is classified as low impedance (i.e., "good") or high impedance (i.e., "bad") based on the obtained measurement or derivative thereof relative to the classification threshold (step 506). For example, if the classification threshold is defined such that a measurement above a threshold capacitance is good, whereas a measurement below the threshold capacitance is bad, then the obtained measurement is compared to the classification threshold and classified as good if the obtained measurement is above the classification threshold (step 507) and classified as bad if the obtained measurement is below the classification threshold (step 508).

In the above embodiments, the impedance of the joint was discussed in terms of pure resistance. It is also possible that the DC impedance is infinite, but that the joint possesses a significant capacitance, which at a suitable test frequency, will have a finite impedance that still qualifies for testing according to embodiments of the invention.

In summary, the preceding discussion describes embodiments that utilize the characteristics specific to a given semiconductor junction(s) in the IC component coupled to the sensor plate to determine a joint's proclivity to non-contact capacitive sensing connectivity testing, to set test parameters such as stimulus voltage level and low- vs. high-classification threshold(s) used for classifying a joint as low- or high-impedance based on a non-contact capacitive sensor measurement, and to perform non-contact capacitive sensing connectivity testing to determine whether a joint is low- or high-impedance. Unlike the traditional IV curve method, the CV results are unaffected by other IC components (with their own semiconductor) on the same node.

Utilizing the semiconductor junction characteristics of each pin, test parameters may be selected to ensure proper classification of a joint between a DUT node and a pin. For example, the stimulus voltage may be selected for a pin that results in a large difference in capacitance between a low- and high-impedance joint. Classification thresholds may be set to ensure proper classification of a joint as low- or high-impedance within the accuracy of the measurements (i.e., that take into account the margin of error of the tester measurements).

By simulating the marginal impedances of each of the pins to be tested, the pins can be classified as allowing or disallowing testing of joints for marginal connectivity.

Those of skill in the art will appreciate that the invented method and apparatus described and illustrated herein may be implemented in software, firmware or hardware, or any suitable combination thereof, and may be implemented using a computer or other processor process in which instructions are executed, the instructions being stored for execution on a computer-readable medium and being executed by any suitable instruction processor. Alternative embodiments are contemplated, however, and are within the spirit and scope of the invention.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for configuring parameters of a capacitive lead-frame test of a device under test, comprising:
    applying a stimulus voltage to a node under test;
    for each of a plurality of series resistance values in a predetermined range of series resistance values, obtaining a corresponding respective measurement representative of the capacitance between a sensor of a capacitive sensing probe and a given component node of a component of the device under test (DUT) to which a DUT node of the DUT is supposed to be connected;
    based on the obtained measurements, determining semiconductor junction characteristics specific to the given component node of the component of the DUT; and
    setting test parameters based on the semiconductor junction characteristics specific to the given component node.

2. The method of claim 1, further comprising:
    generating a current-voltage curve and/or a capacitance-voltage curve based on the obtained measurements.

3. The method of claim 1, wherein the step for setting a test stimulus voltage comprises the steps of:
    selecting a stimulus voltage to be applied to the DUT node to a voltage level which results in a measurable difference in capacitance between a high resistance value and a low resistance value.

4. The method of claim 3, further comprising:
    setting one or more classification thresholds that reliably distinguish between a low-impedance series resistance value and a high-impedance series resistance value at the selected stimulus voltage.

5. The method of claim 4, further comprising the step of: running a non-contact capacitive sensing test on the node under test using the test parameters set based on the semiconductor junction characteristics specific to the given component node.

6. The method of claim 5, wherein the step for running a non-contact capacitive sensing test comprises:
   placing a sensor of a capacitive sensing probe on or in proximity to the component of the DUT;
   applying the selected stimulus voltage to the DUT node of the DUT; and
   obtaining a measurement representative of the capacitance between the component node and the sensor of the capacitive sensing probe.

7. The method of claim 6, further comprising the steps of:
   comparing the obtained measurement or a derivative thereof to the one or more classification thresholds;
   classifying a joint connecting the component node to the DUT node as low impedance or high impedance based on the results of the comparison.

8. A method for determining whether a pin of an electrical component of an electrical device under test (DUT) can be tested for high-impedance connectivity using non-contact connectivity testing, the pin being connected to a semiconductor junction of the electrical component and connected to a DUT node of the DUT, the method comprising:
   obtaining an approximate value of termination resistance between a voltage source and the pin;
   obtaining a stimulus voltage;
   if the approximate value of the termination resistance is approximately zero at the stimulus voltage, performing the steps of:
      determining whether a difference in effective capacitance for a low calibration resistance versus a high calibration resistance between the voltage source and the pin is significant with respect to
      classifying the pin as a good candidate for non-contact connectivity testing if the difference in capacitance is significant with respect to the measurement's accuracy; and
      classifying the pin as not a good candidate for non-contact connectivity testing if the difference in capacitance is not significant with respect to the measurement's accuracy; and
   if the termination resistance is not approximately zero, performing the steps of:
      selecting a calibration resistance close in value to the termination resistance;
      determining whether, at the high end of the stimulus voltage, the difference in effective capacitance for a selected calibration resistance versus a high calibration resistance is significant with respect to the measurement's accuracy;
      classifying the pin as a good candidate for non-contact connectivity testing if the difference in capacitance is significant with respect to the measurement's accuracy; and
   classifying the pin as not a good candidate for non-contact connectivity testing if the difference in capacitance is not significant with respect to the measurement's accuracy.

9. A method for optimizing test parameters specific to a semiconductor junction for use in a non-contact connectivity test by a semiconductor tester, comprising:
   determining a stimulus voltage range corresponding to a measurable difference in capacitance within a measurement accuracy of the tester between a low resistance joint and a high resistance joint at a junction under test;
   selecting a stimulus voltage value within the stimulus voltage range such that the selected stimulus voltage yields a relatively large capacitance measurement difference between a low impedance joint and a high impedance joint;
   selecting one or more classification thresholds to respective one or more values which allow reliable classification of a joint under test as high impedance or low impedance based on a non-contact test measurement representing capacitance between a component node of a component of a device under test that is connected to the joint under test and a sensor of a capacitive sensing probe.

10. The method of claim 9, wherein the step of determining the stimulus voltage range comprises:
    generating a capacitance-voltage curve; and
    finding the range in the capacitance-voltage curve where a difference in capacitance between a high impedance joint and a low impedance joint is a measurable difference within the measurement accuracy of the tester.

11. The method of claim 9, further comprising:
    obtaining a measurement representing capacitance between a component node connected to the joint under test and a sensor of a capacitive sensing probe;
    classifying the joint under test as high impedance or low impedance based on the measurement relative to the one or more classification thresholds.

12. A method for determining connectivity of a joint between a component node of a component of a device under test (DUT) and a DUT node of the DUT, the component node connected to a semiconductor junction within the component of the DUT, the method comprising:
    obtaining semiconductor junction characteristics specific to the component node;
    selecting a stimulus voltage based on the semiconductor junction characteristics specific to the component node, wherein the selected stimulus voltage is set to a value that yields a relatively large capacitance measurement difference between a low impedance joint and a high impedance joint;
    configuring at least one classification threshold based on the semiconductor junction characteristics of the component node, the at least one classification threshold set to allow reliable classification of the joint as high impedance or low impedance based on a non-contact test measurement representing capacitance between a component node of a component of a device under test that is connected to the joint under test and a sensor of a capacitive sensing probe;
    placing a capacitive sensing probe on or in proximity to the component node of the component of the DUT and not on or in proximity to any semiconductor junction of the component that is not connected to the component node;
    applying the selected stimulus voltage to the DUT node;
    obtaining a measurement representative of an amount of capacitance between the component node and the capacitive sensing probe; and
    classifying the joint based on the measurement and the at least one classification threshold.

13. The method of claim 12, wherein the at least one classification threshold is determined based on capacitance-voltage curves of a high impedance joint and a low impedance joint, and the selected stimulus voltage.

14. The method of claim 12 wherein the at least one classification threshold is defined as a threshold capacitance value, and if the measurement represents a capacitance above the threshold capacitance value, the joint is classified as low impedance, and if the measurement is below the threshold capacitance value, the joint is classified as high impedance.

* * * * *

UNITED STATES PATENT AND TRADEMARK OFFICE
CERTIFICATE OF CORRECTION

| | | |
|---|---|---|
| PATENT NO. | : 7,295,031 B1 | Page 1 of 1 |
| APPLICATION NO. | : 11/484952 | |
| DATED | : November 13, 2007 | |
| INVENTOR(S) | : Parker et al. | |

It is certified that error appears in the above-identified patent and that said Letters Patent is hereby corrected as shown below:

In column 13, line 39, in Claim 8, after "to" insert -- the measurement's accuracy; --.

Signed and Sealed this

Tenth Day of June, 2008

JON W. DUDAS
*Director of the United States Patent and Trademark Office*